United States Patent [19]
Eckler

[11] Patent Number: 5,998,102
[45] Date of Patent: Dec. 7, 1999

[54] ETCH INHIBITORS IN DEVELOPER FOR LITHOGRAPHIC PRINTING PLATES

[75] Inventor: Paul E. Eckler, Princeton Junction, N.J.

[73] Assignee: Agfa Corporation, Ridgefield Park, N.J.

[21] Appl. No.: 08/995,465

[22] Filed: Oct. 6, 1997

[51] Int. Cl.⁶ .................................. G03F 7/30; G03F 7/32
[52] U.S. Cl. .............................................. 430/325; 430/331
[58] Field of Search ..................................... 430/331, 325

[56] References Cited

U.S. PATENT DOCUMENTS

| | | | |
|---|---|---|---|
| 4,259,434 | 3/1981 | Yamasue et al. | 430/302 |
| 5,466,559 | 11/1995 | Miller et al. | 430/331 |
| 5,480,762 | 1/1996 | Toyama et al. | 430/302 |

FOREIGN PATENT DOCUMENTS 2046931  11/1980  United Kingdom .

*Primary Examiner*—John S. Chu
*Attorney, Agent, or Firm*—Roberts & Mercanti, L.L.P.

[57] ABSTRACT

A developer composition for photosensitive elements including lithographic printing plates, color proofing films, positive and negative working lithographic plates and thermally sensitive plates giving high image contrast and reduced oxide attack to image surfaces said composition comprises: a source of hydroxyl ions sufficient to provide said developer composition to have a pH of from about 10 to about 14; an optional buffer; an etch inhibiting additive, and sufficient water to produce a developer composition. A method for forming an image also is disclosed.

18 Claims, No Drawings

ETCH INHIBITORS IN DEVELOPER FOR LITHOGRAPHIC PRINTING PLATES

BACKGROUND OF THE INVENTION

The present invention relates to developer compositions for photosensitive elements including lithographic printing plates. More particularly, the invention relates to alkaline developer compositions having etch inhibitors. Even more particularly, the developer compositions have surface active agents which are not good wetters which protect image areas of the lithographic printing plates from etching or attack by the alkaline developer.

The art of lithographic printing depends on several factors which include the immiscibility of greasy ink and water, the preferential retention of a greasy ink by an image area of a printing plate, and a preferential retention of an aqueous dampening fluid by a non-image area. As an aqueous fountain solution moistens the surface of an exposed and developed plate on a printing press, the image area repels the water and the non-image area retains the water. With a subsequent application of greasy ink, the image portion retains the ink and the moistened non-image area repels it. The ink on the image area is then transferred to the surface of the material on which the image is to be reproduced, such as paper, via an offset blanket. The most common type of lithographic plate to which the present invention is directed has a coating of a light sensitive substance that is adherent to an aluminum base sheet. Depending on the nature of the photosensitive coating employed, the plate may be positive or negative working. In both cases, the image area is oleophilic and the non-image areas are hydrophilic. Exposure is effected through a transparent mask or via laser imaging, wherein the light sensitive layer, in the negative working case, hardens and becomes insoluble in a developing solution. When the developer is applied to the plate, the unexposed, non-image areas are removed. In the positive working case, the exposed areas become soluble in an aqueous alkaline developer and are removed thereby. In both cases the remaining areas become the portions which attract greasy ink and are called the image areas. The surface underlying the areas from which the light sensitive coating have been removed are hydrophilic, do not attract greasy ink and are called the non-image areas.

Generally, these plates are composed of an aluminum containing substrate which may or may not have been treated with a variety of processes recognized in the art including anodization, graining and hydrophilization. The prepared plate substrate may then be applied with a photosensitive coating comprising a photosensitizer, binding resins, colorants, acid stabilizers, surfactants and other art recognized components. Common photosensitizers include diazo compounds, including polymeric diazonium condensates salts and o-quinone diazides, and photopolymerizable compositions. Sensitizers, binders and printing plates employing aromatic diazonium compounds are described in U.S. Pat. Nos. 3,175,906; 3,046,118; 2,063,631; 2,667,415; 3,867,147 and 3,679,419.

The photosensitive layer may be exposed to suitable radiation either through a transparency or directly using laser imaging techniques. Hence, development of the plate with an aqueous alkali solution should result in the exclusive removal of the non-image areas of the photosensitive layer.

A number of positive acting printing plates are supplied commercially, which include the P-51 manufactured by the Agfa Division of Bayer Corporation.

The invention also relates to developer compositions for negative working photographic elements, such as lithographic printing plates. These include the N-81 and N-90, products of Agfa Division of Bayer Corporation.

The present invention is also useful for developing color proofing films. Such color proofing films assist a printer in correcting a set of photomasks which will be used in exposing printing plates. Visual examination of a color proof should reveal any defects on the photomask, the best color rendition to be expected from press printing of the material; the correct gradation of all colors; and whether there is a need for changing any of the colors and/or for altering the film photomask before making printing plates.

Generally, color proofing films are composed of a transparent substrate, which may or may not have been treated for release, slip or adhesive properties. The transparent substrate is then applied with a photosensitive coating comprising a photosensitizer, binding resins, colorants, acid stabilizers, surfactants and other art recognized components. Common photosensitizers include o-quinone diazides, diazonium condensates salts and photopolymerizable compositions. They are exposed and developed in a similar manner as printing plates. U.S. Pat. Nos. 4,260,673; 4,093,464; 4,093,464; 4,260,673; and 4,659,642 teach typical color proofing systems.

It has been found that during the development of positive and negative working photosensitive elements, there is a tendency for the developer to also attack the image areas of the exposed photosensitive coating. This results in an unwanted etching away and removal of image areas of the element, thus producing a defective image. The present invention solves this problem by the inclusion of certain etch inhibiting compounds in the developer composition.

The developer composition inhibits etching of the image areas of the lithographic printing plate. The etch inhibiting additive allows use of the developer in concentrations and under temperatures that would otherwise cause degradation of the image areas on the plate. This provides greater operating latitude for exposure requirements, such as time and energy, mechanical agitation and developer contact time to produce printing plates of suitable quality. Developers of this invention are suitable for use with an array of printing plates, including lithographic printing plates, color proofing films, positive and negative working lithographic plates and thermally sensitive plates.

SUMMARY OF THE INVENTION

The invention provides a developer composition for photosensitive elements which comprises:

a source of hydroxyl ions in an amount sufficient to produce a developer composition having a pH of from about 10 to about 14;

an etch inhibiting amount of an etch inhibiting additive of the formula:

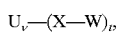

wherein,

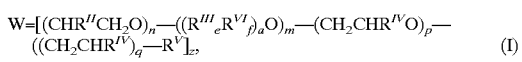

$R^V$ is H, $PO_3H_2$, $SO_3Na$, $—CH_2CO_2H$, halogen, a linear or branched alkyl group, alkylaryl, arylalkyl, cycloalkyl, or alkylarylalkyl, $R^V$ having up to about 30 carbon atoms; $R^{II}$ and $R^{IV}$ are independently H, linear or branched alkyl group, alkylaryl, arylalkyl, cycloalkyl, or alkylarylalkyl, having up to about 30 carbon atoms; $R^{III}$ and $R^{VI}$ are independently methylene, alkyl methylene, dialkyl methylene, aryl methylene, cycloalkyl methylene, alkyl aryl methylene, or arylalkyl methylene, having up to about 30 carbon atoms; a=1 to about 30; e=0 to about 30, f=1 to about 30; z=1–3; m, n and p are zero or positive numbers up to about 150, provided that at least one of n, m and p is non-zero, and q is zero except q=1 when $R^V$ is a halogen;

and wherein, a) X is a halogen, v=0 and t=1; or, b) X is $R^I(CO)_d Y$, wherein $R^I$ is H, $PO_3H_2$, $SO_3Na$, $—CH_2CO_2H$, linear or branched alkyl group, alkylaryl, arylalkyl, cycloalkyl, or alkylarylalkyl, having up to about 30 carbon atoms, d=0 or 1, v=0, t=1, and Y=O, S, P or N; or, c) X is selected from the group consisting of O, N, S, P, esters, urethanes and amino resin linkages, U is a polymer chain backbone, and v=1, wherein the value of t is such that $(X—W)_t$ comprises greater than about 50 percent by weight of the total weight of the compound $U_v—(X—W)_t$; and, sufficient water to provide for a developer composition.

The invention also includes a method for forming an image by image-wise exposing a photosensitive element to actinic radiation, which photosensitive element comprises a substrate and a photosensitive composition on the substrate, which photosensitive composition comprises a photosensitizer and an alkali soluble binder; and then removing the non-image areas of the photosensitive composition by contacting the photosensitive composition with the above developer.

DETAILED DESCRIPTION OF THE PREFERRED EMBODIMENT

The developer composition of the present invention comprises an alkali source, an etch inhibiting additive, and water. The developer provides a source of alkalinity. This alkalinity may be supplied by a variety of materials. Due to equilibrium processes that occur in an aqueous environment, the alkalinity of an aqueous solution may be conveniently indicated by its pH. pH is a direct measure of the hydronium ion concentration in solution, but is an indication of the hydroxide ion concentration in solution. Hydroxide ions are usually regarded as the active developing agent.

Any material that creates a suitably high pH may be used as a source of alkalinity. A pH of from about 10 to about 14 is preferred, from about 12 to 13.5 more preferred, and from about 13 to about 13.5 most preferred. The most common alkalis are hydroxides of the alkali metals, i.e., sodium hydroxide, potassium hydroxide, lithium hydroxide, rubidium hydroxide, and cesium hydroxide. Hydroxides of tetraalkyl quaternary amines or "quats" may be used including especially tetramethylammonium hydroxide or choline hydroxide. Amines such as monoethanolamine, diethanolamine, triethanolamine, 2-amino-2-methyl-1-propanol, monoisopropanolamine, diisopropanolamine, triisopropanolamine, tris-(hydroxymethyl)aminomethane, dialkylalkanolamines such as N,N-dimethylethanolamine or N,N-dimethylaminoisopropanol, or N-alkyldialkanolamines such as N-methyldiethanolamine may also be used. Ammonium hydroxide, and water soluble alkylamines such as monomethylamine, dimethylamine, trimethylamine, ethylamines, propylamines, butylamines, etc., are usually not used due to their high odor but may be incorporated in some formulations. Preferred ingredients are sodium and potassium hydroxide. Mixtures incorporating two or more of the above ingredients may be used.

The etch inhibiting additive of the present invention comprises one or more surface active agents, known as surfactants, which have poor to average wetting capability. It has been found that surfactants having good to excellent wetting capability promote etching when used as an additive in developers for lithographic printing plates.

The etch inhibiting additive of the present invention comprises a composition of the formula:

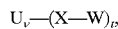

wherein,

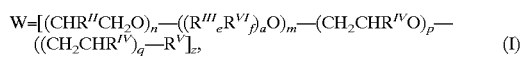 (I)

$R^V$ is H, $PO_3H_2$, $SO_3Na$, $—CH_2CO_2H$, halogen, a linear or branched alkyl group, alkylaryl, arylalkyl, cycloalkyl, or alkylarylalkyl, $R^V$ having up to about 30 carbon atoms; $R^{II}$ and $R^{IV}$ are independently H, linear or branched alkyl group, alkylaryl, arylalkyl, cycloalkyl, or alkylarylalkyl, having up to about 30 carbon atoms; $R^{III}$ and $R^{VI}$ are independently methylene, alkyl methylene, dialkyl methylene, aryl methylene, cycloalkyl methylene, alkyl aryl methylene, or arylalkyl methylene, having up to about 30 carbon atoms; a=1 to about 30; e=0 to about 30, f=1 to about 30; z=1–3; m, n and p are zero or positive numbers up to about 150, provided that at least one of n, m and p is non-zero, and q is zero except q=1 when $R^V$ is a halogen;

and wherein, a) X is a halogen, v=0 and t=1; or, b) X is $R^I(CO)_d Y$, wherein $R^I$ is H, $PO_3H_2$, $SO_3Na$, $—CH_2CO_2H$, a linear or branched alkyl group, alkylaryl, arylalkyl, cycloalkyl, or alkylarylalkyl, having up to about 30 carbon atoms, d=0 or 1, v=0, t=1, and Y=O, S, P or N; or, c) X is selected from the group consisting of O, N, S, P, esters, urethanes and amino resin linkages, U is a polymer chain backbone, and v=1, wherein the value of t is such that $(X—W)_t$ comprises greater than about 50 percent by weight of the total weight of the compound $U_v—(X—W)_t$.

Each of the component monomer units, $(CHR^{II}CH_2O)$, $(R^{III}_e R^{VI}_f)_a O)$, and $(CH_2CHR^{IV}O)$ may be present in the compound as block, gradient or randomly occurring copolymer units.

In a preferred embodiment, the etch inhibiting additive comprises block copolymers of the general formula above in which $R^I=R^V=H$, $R^{II}=R^{IV}=H$, $R^{III}=CHCH_3—$, $R^{IV}=CH_2—$, Y=O, a=1, d=0, e=1, f=1, and z=1. These products may be made by ethoxylation of polypropylene glycols. The value of m in the polypropylene glycol component is such that the molecular weight of the polypropylene glycol segment is from about 500 to about 4000. The values of n and p are such that the molecular weight of ethylene oxide component is from about 10% to about 80% of the total weight of the product.

Several variations of the preferred embodiment are useful as the etch inhibiting additive component of the claimed invention. The terminal hydroxyl groups of the etch inhibiting additive may be replaced by chlorine atoms. Etch inhibiting additives in which $R^{III}$ is $C_2H_5CH$, larger alkyl methylene, or aryl methylene also are desirable. Additionally, etch inhibiting additives in which $R^I=R^V=$ alkyl, alkylaryl, arylalkyl, or cycloalkyl or in which $R^I$ is H and $R^V$=alkyl, alkylaryl, arylalkyl, or cycloalkyl also are desirable.

Reverse block copolymers of the above formula in which $R^I=R^V=H$, $R^{II}=R^{IV}=CH_3$—, $R^{III}=CH_2$, $R^{VI}=CH_2$—, Y=O, a=1, d=0, e=1, f=1, and z=1 also are useful in the present invention. These compounds may be made by propoxylation of polyethylene glycols. The value of m, such that the molecular weight of polyethylene glycol is between about 1000 and 3500, are preferred, with between about 2500 and 3500 being most preferred. The values of n and p are such that the weight of polyethylene glycol is from about 10% to about 80% of the total weight of the composition. Additionally, $R^{II}=R^{IV}$ may be ethyl, larger alkyl, or aryl.

Other useful etch inhibiting additives are alcohol ethoxylates optionally containing higher oxides where $R^I$ is a linear or branched alkyl group, optionally containing cycloalkyl groups, containing a total of 1 to 20 carbons, $R^{II}$ is H, n is from about 2 to about 150, m and p are zero, $R^V$ is H, Y=O, d=0, a=1, e=1, f=1, and z=1.

Etch inhibiting additives may also be alkylphenol ethoxylates optionally containing higher oxides where $R^I$ is an aryl group substituted with one or more linear or branched alkyl groups containing 4 to 20 carbons, $R^{II}$ is H, n is from about 2 to about 150, m and p are zero, $R^V$ is H, Y=O, d=0, a=1, e=1, f=1, and z=1.

Also useful are capped ethoxylates such as the alcohol ethoxylates and alkylphenol ethoxylates listed above, in which the terminal hydroxyl group is reacted with a higher oxide such as propylene oxide, butylene oxide, styrene oxide, etc. ($R^{IV}=C_1$ to $C_{20}$ linear, branched or cyclic alkyl, aryl or alkylaryl, p=1 to 9), or the terminal hydrogen is replaced with an alkyl or aryl alkyl group, especially benzyl ($R^V=C_1$ to $C_{20}$ linear, branched or cyclic alkyl, aryl, alkylarylalkyl, arylalkyl, or alkylaryl), or the hydroxyl is replaced with a halogen such as chlorine ($R^V$—=Cl or Br).

Etch inhibiting additives may be polyethylene glycols optionally containing higher oxides (i.e., random copolymers) of molecular weight greater than 500 ($R^I=R^V=$ H, $R^{III}=R^{III}=CH_2$, n=p=0, Y=O, d=0, a=1, e=1, f=1, z=1, m>9), and/or derivatives in which one or both of the terminal hydroxyl groups is reacted with a higher oxide such as propylene oxide, butylene oxide, styrene oxide, etc., ($R^I=R^V=$H, $R^{III}=R^{VI}=CH_2$, m=0, $R^{IV}=C_1$ to $C_{20}$ linear, branched or cyclic alkyl, aryl or alkylaryl, p=1 to 9, Y=O, d=0, a=1, e=1, f=1, z=1, n>9) or the terminal hydrogen is replaced with an alkyl or aryl alkyl group, especially benzyl, ($R^I=R^V=C_1$ to $C_{20}$ linear, branched or cyclic alkyl, aryl, alkylarylalkyl, or alkylaryl, $R^{III}=R^{VI}=CH_2$, n=p=0, Y=O, d=0, a=1, e=1, f=1, z=1, m>9) or the hydroxyl is replaced with a halogen such as chlorine or bromine, (X=$R^V$—=Cl or Br, $R^{III}=R^{VI}=CH_2$, n=p=0, Y=O, d=0, a=1, e=1, f=1, z=1, m>9).

Derivatives of ethoxylates such as the block copolymers, alcohol ethoxylates and alkylphenol ethoxylates listed above, in which one or more of the terminal hydroxyls is replaced with phosphate, sulfate, or ether carboxylate such as —$CH_2CO_2H$ ($R^I=R^V=PO_3H_2$, $SO_3Na$, or —$CH_2CO_2H$ unless $R^I$ is already designated as other than H), are also useful.

Useful etch inhibiting additives also are ethoxylates of linear or branched primary alkyl amines optionally containing higher oxides ($R^I$ is a linear or branched alkyl group, optionally containing cycloalkyl groups, containing a total of 6 to 20 carbons, $R^{II}$ is H, n is from about 1 to about 75, m and p are zero, $R^V$ is H, Y=N, d=0, e=1, f=1, and z=2) and/or their derivatives capped with higher oxides, especially propylene oxide or butylene oxide (same, but $R^{IV}=C_1$ to $C_{20}$ linear, branched or cyclic alkyl, aryl or alkylaryl, p=1 to 9).

Additionally, the etch inhibiting additives may be ethoxylates of linear or branched alkyl mercaptans optionally containing higher oxides containing ($R^I$ is a linear or branched alkyl group, optionally containing cycloalkyl groups, containing a total of 6 to 20 carbons, $R^{II}$ is H, n is from about 2 to about 150, m and p are zero, $R^V$ is H, Y=S, d=0, and z=1) and/or their derivatives capped with higher oxides, especially propylene oxide or butylene oxide (same, but $R^{IV}=C_1$ to $C_{20}$ linear, branched or cyclic alkyl, aryl or alkylaryl, p=1to 9) or alkyl groups, especially benzyl ($R^V=C_1$ to $C_{20}$ linear, branched or cyclic alkyl, aryl, alkylarylalkyl, or alkylaryl).

The etch inhibiting additives also include block copolymers of polyfunctional amines such as ethylene diamine reacted with propylene oxide and then ethylene oxide or reacted with ethylene oxide and then propylene oxide.

Branched chain polyols prepared by the reaction of ethylene oxide optionally containing higher oxides with polyfunctional initiators such as glycerin, trimethylolpropane, trimethylolethane, pentaerythritol, erythritol, glucose, sucrose, mannitol, sorbitol, fructose, corn syrup, molasses, cellulose, cellulose derivatives, starch, starch derivatives, monoethanolamine, 2-amino-2-methyl-1-propanol, tris(hydroxymethyl)aminomethane, isopropanolamine, and the like, and/or their derivatives in which one or more of the terminal hydroxyl groups is reacted with a higher oxide such as propylene oxide, butylene oxide, styrene oxide, etc., or one or more of the terminal hydrogens is replaced with an alkyl or aryl alkyl group, especially benzyl, or the hydroxyl is replace with a halogen such as chlorine also are useful etch inhibiting additives.

Polymers modified to contain polyethylene glycol segments optionally including higher oxides such as 1) ethoxylates of hydroxyl, carboxyl, or amino functional polymers such as polyvinyl alcohol, polyvinyl butyral, polyvinyl formal, polyvinyl acetate, polyacrylic acid, polymethacrylic acid or their co-polymers;
2) ethoxylates optionally including higher oxides coupled to active monomers and then polymerized such as polymers and co-polymers of,
    i) polyethylene glycol monomethacrylate (HEM-5, HEM-8, HEM-10, etc.) or monoacrylate optionally where the terminal hydroxyl is capped as with chlorine, a higher oxide, or an R group such as alkyl, cycloalkyl, aryl, etc.;
    ii) polyethylene glycol monoethers or esters reacted with monomers such as dimethylisocyanatomethyl-isopropenylbenzene;
3) polyethylene glycol optionally including higher oxides grafted to pre-formed polymer chains by methods well known in the art such as by coupling with a difunctional material such as a diisocyanate, or a dicarboxylic acid, ester, or acid chloride to a hydroxyl or amino functional polymer; and,
4) polymers, resins or oligomers made with polyethylene glycol optionally including higher oxides in the main chain such as polyurethanes, polyesters, or alkyd resins, also are useful as etch inhibiting additives.

Esters of polyethylene glycol optionally containing higher oxides optionally linear or branched, prepared either by ethoxylation of carboxylic acids or by esterification of polyethylene glycols ($R^I$=is a linear or branched alkylacyl group, optionally containing cycloalkyl groups, containing a total of 6 to 20 carbons $R^{III}=R^{VI}=CH_2$, $R^V=R^I$ or H, n=p=0, Y=O, d=0, a=1, e=1, f=1, z=1, m>9) optionally capped with higher oxides ($R^{IV}$ may be $C_1$ to $C_{20}$ linear, branched or cyclic alkyl, aryl or alkylaryl, p=1 to 9), ethers, or halogen ($R^V$ may be $C_1$ to $C_{20}$ linear, branched or cyclic alkyl, aryl, alkylarylalkyl, or alkylaryl or —$OR^V$ may be halide) are useful etch inhibiting additives.

Additionally, polyglycols such as:
1) polypropylene glycol, polybutylene glycol, etc. where a=12, m is from 5 to 100, e=0 to 30, f=1 to 30, and $R^{VI}$ and $R^{III}$ are independently methylene, alkyl methylene, dialkyl methylene, aryl methylene, cycloalkyl methylene, alkyl aryl methylene, or arylalkyl methylene, having up to about 30 carbon atoms; including block, gradient and random copolymers and compositions that contain ethylene glycol units, and,
2) polymethylene glycol, poly-1,3-propanediol, poly-1,4-butanediol, poly-1,5-pentanediol, poly-1,6-hexanediol, poly-2-methyl-1,3-propanediol, polyneopentyl glycol, etc. where a is an integer from 0 to 30, m is from 1 to 100, $R^{III}$ and $R^{VI}$ are any combination of methylene, alkyl methylene, dialkyl methylene, aryl methylene, cycloalkyl methylene, alkyl aryl methylene, or arylalkyl methylene including block and random copolymers and compositions that contain ethylene glycol units, are useful etch inhibiting additives.

Such materials include not only those made by ring opening of a cyclic ether, but also those made by condensing derivatives of glycols with glycols in the presence of base as is known in the art. For example the reaction of 1,3-dichloropropane, a derivative of 1,3-propanediol, with 1,6-hexanediol in the presence of bases such as sodium hydroxide to produce an alternating copolymer of 1,6-hexanediol with 1,3-propanediol. Other derivatives that may be used include alkyl, aryl, alkylaryl, or arylalkyl sulfonate esters such as methanesulfonate esters or toluenesulfonate esters or bromide or other halide derivatives. Monoderivatives may also be used such as the condensation of 1-chloro-12-hydroxydodecane with itself in the presence of sodium hydroxide.

The preferred compositions of the alkoxylates and/or derivatives of the present invention are those etch inhibiting additives with a calculated hydrophilic/lipophilic balance (HLB) greater than 12.5 (i.e., more than 62.5% ethoxylate and propoxylate combined) except when the hydrophobe contains very long straight chain alkyl groups, i.e., >17 carbons per chain, the HLB must be greater than 15.5 (more than 77.5% ethoxylate and propoxylate combined) or where the hydrophobe is very short, or absent, i.e. <6 carbons, molecular weight must be greater than 500. Preferred etch inhibiting additives include Antarox L-61, a product of Rhone Poulenc, described as a block copolymer prepared by the addition of 10% ethylene oxide to polypropylene glycol of approximately 1800 molecular weight, a blend of about 80% Pluronic L-43 with 20% Pluronic L-31, both products of BASF Corporation. Pluronic L-43 is described as a block copolymer prepared by the addition of 30% ethylene oxide to polypropylene glycol of approximately 1300 molecular weight. Pluronic L-31 is described as a block copolymer prepared by the addition of 10% ethylene oxide to polypropylene glycol of approximately 1000 molecular weight, and Rhodasurf LA-12, a product of Rhone-Poulenc, described as the 12 mole ethoxylate of lauryl alcohol.

As known in the art, HLB stands for hydrophilic/lipophilic balance and is a common method for classifying nonionic surfactants, most of which are ethoxylates. The HLB is usually calculated from the weight percentage of ethylene oxide and propylene oxide in the theoretical composition. The HLB scale ranges from 0 to 20, with 20 corresponding to 100% alkoxylate. An HLB of 10 indicates the presence of 50% alkoxylate in the composition.

The etch inhibiting additives component is preferably present in the aqueous mixture in an amount of from about 25 ppm to about 25% by weight of the overall composition, more preferably from about 25 ppm to about 5%, even more preferably from about 0.01% to about 1%, and most preferably from about 0.02% to 0.20%.

The composition may include optional additional ingredients, including buffering salts and hydrotropes, wetting agents, emulsifiers, organic solvents, chelating agents, biocides, other salts, fragrances, corrosion inhibitors, antifoams, dispersants, and the like.

Typical buffering ingredients are salts of weak acids and may be added either as the salt itself, as the acid or in the case of polybasic acids as partial acid salts. When an acidic ingredient is used, the alkali neutralizes the acidity consuming part of the alkali. Hence, the amount of alkali must be increased. For example, in the case of phosphate buffer with sodium hydroxide as the alkali, the same formulation may be prepared with phosphate added as trisodium phosphate, disodium phosphate, monosodium phosphate or phosphoric acid, but the sodium hydroxide requirement increases with the acidity of the buffer.

Certain buffers such as trisodium phosphate and sodium metasilicate are typically overbased as supplied. That is, the commercial product contains more alkali than expected from its theoretical formula. With overbased buffer salts, the amount of alkali required is reduced.

Examples of buffers, which are commonly called builders in the detergent industry, include phosphate, pyrophosphate (Rhodes, U.S. Pat. No. 2,365,215, 1944), tripolyphosphate (Votz, U.S. Pat. No. 2,356,550, 1944), hexametaphosphate, carbonate, citrate (Tucker, U.S. Pat. No. 2,264,103, 1941), borate, tetraborate, silicate (Rhodes, U.S. Pat. No. 2,365, 215, 1944), metasilicate, gluconate (Lehmkuhl, U.S. Pat. No. 2,291,085, 1942, Tucker, U.S. Pat. No. 2,311,008, 1943), nitrilotriacetate and ethylenediamine tetracetate (Munz, U.S. Pat. No. 2,130,505, 1938, U.S. Pat. No. 2,240, 957, 1941; Orthner, U.S. Pat. No. 2,257,186, 1941; Drew, U.S. Pat. No. 3,001,945, 1961), glycolate, tartrate, oxalate, succinate (Brown, U.S. Pat. No. 3,661,787, 1972), maleate, malate, lactate, glutarate, malonate, salts of polycarboxylic acids (Tucker, U.S. Pat. No. 2,264,103, 1941, Aaschke, U.S. Pat. No. 3,686,145, 1972), sorbitol ether carboxylates (Tucker, U.S. Pat. No. 2,311,008, 1943), carboxymethyl cellulose (Nuesslein, U.S. Pat. No. 2,335,194, 1943), sulfate (Flett, U.S. Pat. No. 2,387,572, 1945), dextrin (Bonewitz, U.S. Pat. No. 2,678,303, 1954), hydroxyethylidenediphosphonate (Diehl, U.S. Pat. No. 3,159,581, 1964, Blaser, U.S. Pat. 3,214,454, 1965), phosphonates (Quimby, U.S. Pat. No. 3,400,148, 1968), cycloalkane polycarboxylate (Carter, U.S. Pat. No. 3,463,734, 1969), polyacrylates, polymaleates, derivatives and their copolymers (Sabatelli, U.S. Pat. No. 3,535,258, 1970, U.S. Pat. No. 3,579,455, 1971, Dittmar, U.S. Pat. No. 2,327,302, 1943, Feldman, U.S. Pat. No. 2,876,201, 1959, Diehl, U.S. Pat. No. 3,308,067, 1967, Carter, U.S. Pat. No. 3,463,734, 1969, Mizuno, U.S. Pat. No. 3,700,599, 1972, Mizuno, U.S. Pat. No. 3,764,559, 1973, Chakrabarti, U.S. Pat. No. 3,733,280, 1973, Altenschopfer, U.S. Pat. No. 3,825,498, 1974, Lamberti, U.S. Pat. No. 4,095,035, 1978), oxydisuccinate (Lambert, U.S. Pat. No. 3,635,830, 1972), carboxymethoxysuccinate (Lamberti, U.S. Pat. No. 3,692,685, 1972), sucrose (Finck, U.S. Pat. No. 3,826,748, 1972), dihydroxyhexadecyl succinate (Pettigrew, U.S. Pat. No. 3,725,286, 1973), N-oxides of nitrilotriacetate and ethylenediamine tetracetate (Blum, German Patent DE 2,903,980, 1980), formate, propionate, benzoate, toluate, phthalate, isophthalate, terephthalate, trimellitate, hydroxybenzoate, aminobenzoate, and acetate. See also Herrmann, U.S. Pat. No. 3,346,873, Column 5, 1967.

Silicates are the preferred buffer, especially sodium and potassium silicates. Sodium metasilicate or solution grades of sodium silicate or potassium silicate may be used. Commercial products of this type include STAR and Kasil, products of PQ Corporation. Mixtures of two or more buffers may be used. When mixed alkalis are present from any source, it is understood the buffers may be present in mixed salt form, such as for example monosodium dipotassium phosphate or mixtures of sodium acetate and potassium acetate when only sodium acetate was added as the buffer in the initial formulation.

The amount of buffer, when used is preferably from about 1% to about 15% as solids of the composition. An amount of from about 2% to about 4% is more preferred, and a level of from about 2.5 to about 3% sodium silicate (from about 7.3 to about 8.1% of 37% solids sodium silicate solution) is most preferred. A level of from about 6.5 to about 7.5% sodium metasilicate is especially preferred. The amount useful for any particular embodiment may be easily determined by those skilled in the art.

In addition to the acidity of the other ingredients, the amount of alkali needed also depends on the equivalent weight of the alkali. The pH is preferably from about 10 to about 14, more preferably from about 12 to about 13.5, and most preferably from about 13.0 to about 13.5.

In the absence of buffers, the preferred level of sodium hydroxide is from about 1.0 to about 1.2%, of potassium hydroxide is from about 1.5 to about 2.0%, or of lithium hydroxide is from about 0.6 to about 0.7%. In the presence of sodium silicate buffer, the preferred level of sodium hydroxide increases to from about 1.50% to about 2.25%. In the presence of sodium metasilicate buffer, the preferred level of sodium hydroxide is reduced to from about 0.45% to about 0.52%.

The etch inhibiting additives may be broadly classified as either water soluble or water insoluble. However, the alkalis and buffer salts of the present invention tend to reduce the solubility of organics in water. As a result, certain materials that are regarded as water soluble may be not be soluble in the developer formulations. In that case, hydrotropes may be used to disperse the composition.

Hydrotropes known in the art include sodium xylene sulfonate (Bright, U.S. Pat. No. 3,303,136, 1967), Dowfax 2A1 (sodium salt of sulfonated dodecyldiphenyl ether), salts of pelargonic acid, or Westvaco Diacid 1550 (acrylated derivative of tall oil fatty acid, Ward, U.S. Pat. No. 3,734, 859, 1973; Woodward, U.S. Pat. No. 3,956,161, 1976). Others which may be used include alkylaminopropionates and alkyliminodipropionates (Mirataine JC-HA and Mirataine H2C-HA), phosphated alcohols or ethoxylates of alcohols or alkylphenols, i.e., phosphate ester surfactants such as Rhodafac RA-600 (Grifo, U.S. Pat. No. 3,122,508, 1964; Steifeik, U.S. Pat. No. 3,168,478, 1965; Mansfield, U.S. Pat. No. 3,235,627, 1966; Dupre, U.S. Pat. No. 3,294, 693, 1966) or Triton H-66 (Sorgenfrei, U.S. Pat. No. 4,001, 133, 1977), $C_6$ to $C_{14}$ fatty acid soaps (Carroll, U.S. Pat. No. 3,234,138, 1966), oleate soaps (Bright, U.S. Pat. No. 3,156, 655, 1964), salts of alkenyl especially octenyl succinic acid (Dupre, U.S. Pat. No. 3,579,453, 1971), amine oxides as Armox DMC-W (Laufer, U.S. Pat. No. 3,876,551, 1975), lower alkyl benzene or naphthalene sulfonates (Hewitt, U.S. Pat. No. 3,843,543, 1974; Smith, U.S. Pat. No. 3,192,166, 1965), salts of alcohol sulfates such as amyl, hexyl, octyl, decyl or lauryl sulfates (Hewitt, U.S. Pat. No. 3,843,543, 1974), propylene glycol (Tridge, U.S. Pat. No. 3,037,935, 1962), ethylene maleic anhydride copolymers (Tuveil, U.S. Pat. No. 3,235,505, 1966), and maleic/vinyl ether copolymers (Bright, U.S. Pat. No. 3,156,655, 1964).

Hydrotropes are preferably used in an amount of from 0 to about 10 times the amount of the etch inhibiting additive, more preferably from about 0.1 to about 5 times the amount of the etch inhibiting additive, and most preferably from about 0.5 to about 2 times the amount of the etch inhibiting additive.

The developer composition of the invention is preferably mixed, adding the appropriate amounts of the hydroxyl ion source, etch inhibiting additive, and water, individually. Preferably, the etch inhibiting additive is added to water, after which the source of hydroxyl ions is added in such an amount as to produce an acceptable pH.

As the first step in the production of negative or positive working photographic elements such as lithographic printing plates, a sheet substrate such as aluminum compositions suitable for the manufacture of lithographic printing plates such as Alcoa 3303 and Alcoa 110, which may or may not have been pretreated by standard mechanical or electrolytic graining and/or etching and/or anodizing techniques as are well know in the art, and also may or may not have been treated with a composition, such as polyvinyl phosphonic acid, suitable for use as a hydrophilizing layer for lithographic plates is coated with a light sensitive polymeric diazonium salt, quinone diazide or photopolymer containing composition. Such compositions may also contain binding resins, such as polyvinyl acetal or polyvinyl formal resins, novolaks, polyurethanes, polyvinyl acetates, styrene/maleic anhydride copolymers, colorants, acid stabilizers, surfactants, exposure indicators or other art recognized ingredients.

The photosensitive sheet material is then exposed to a suitable radiation source through a mask or transparency, and the exposed sheet then developed for removal of the non-image photosensitive materials.

The mixture is usually prepared in a solvent composition which is compatible with all the other composition ingredients. The light sensitive composition is then coated on the substrate and the solvent dried off.

Diazonium compounds most commonly employed in the preparation of light sensitive compositions suitable for the present application may be characterized by the generic structure $A-N_2^+X^{31}$, wherein A is an aromatic or heterocyclic residue and X is the anion of an acid.

Specific examples of light sensitive diazonium materials useful as aforementioned include higher molecular weight compositions obtained, for example, by the condensation of certain aromatic diazonium salts in an acid condensation of certain aromatic carbonyl compounds such as formaldehyde as disclosed for example in U.S. Pat. Nos. 2,063,631 and 2,667,415. A preferred class of diazonium compounds is described in U.S. Pat. No. 3,849,392.

A most preferred diazonium salt is the polycondensation product of 3-methoxy-4-diazo-diphenyl amine sulfate and 4-4'-bis-methoxy-methyl-diphenyl ether, precipitated as the mesitylene sulfonate, as taught is U.S. Pat. No. 3,849,392.

Suitable photopolymerizable compositions are well known to the skilled artisan.

The present invention provides a method for developing such exposed photosensitive elements by contacting them, to remove the non-image areas, using the above developer which contains the aforementioned ingredients in an aqueous mixture. The method is more fully described in U.S. Pat. No. 4,980,271 which is incorporated herein by reference.

The method is likewise applicable to positive and negative working color proofing films such as described in U.S. Pat. No. 4,937,168 which is incorporated herein by reference.

In operation, a photosensitive color proofing film element as in U.S. Pat. No. 4,937,168 is laminated to a receptor sheet via the adhesive layer. The receiver sheet should be water resistant to aqueous developers. Plastic or plastic-coated receiver sheets are useful for this purpose. Rough textured and/or adhesion promoted surfaces are preferred for the receiver, which must be able to withstand the laminating and development processes.

Lamination may be conducted by putting the receiver sheet in contact with the adhesive side of the colored composite and then introducing the two materials into the nip of a pair of heated laminating rollers under suitable pressure. Suitable laminating temperatures usually range from about 60° C. to about 90° C., preferably about 75° C. to about 85° C. After lamination, the element substrate is peeled away, usually merely employing manual peeling forces. The adhesive and photosensitive layers thus remain on the receiver sheet.

The photosensitive layer is imagewise exposed by means well known in the art either before or after lamination. Such exposure may be conducted by exposure to a UV light source through a photomask under vacuum frame conditions. Exposure may be performed with actinic light through a conventional positive or negative flat. Exposures after lamination and substrate removal are preferred for emulsion-to-emulsion contact. Mercury vapor discharge lamps are preferred over metal halide lamps. Filters may be used to reduce light scattering in the material.

After lamination, substrate removal and exposure, the photosensitive layer is developed by dissolving the exposed area in the developer of this invention. The process can then be repeated whereby another photosensitive element having a different color is laminated to the same receiver sheet over the previously formed image. In the usual case, four colored layers are employed to produce a full color reproduction of a desired image. These are cyan, magenta, yellow and black. The above photographic element is described in more detail in U.S. Pat. Nos. 4,937,168 and 4,659,642 which are incorporated herein by reference. The present invention provides a method for developing such exposed photosensitive elements by contacting them, to remove the non-image areas, using a developer which contains the aforementioned ingredients in an aqueous mixture. Exposed plates may be developed either manually or in a mechanical processor. When developed manually, the developer solution is poured over the surface of the plate and the surface of the plate is rubbed with a sponge or other flexible device to facilitate removal of the exposed non-image areas of the photosensitive layer. The excess developer is then rinsed from the plate. A fixative or finish may be applied. These functions in a mechanical processor are carried out continuously. The flexible plate is carried through a series of stages including developer and rinse stages. Mechanical agitation is provided by rotating brushes. In the mechanical processor, the developer is typically maintained near ambient temperature, but may be heated to about 35° C. The developer time is typically 30 to 90 seconds. The developer speed is typically 10–60 inches per minute.

EXAMPLE 1

The following test method measures the tendency of an alkaline developer to attack or etch the image areas of the photosensitive layer of a printing plate.

Seven Spot Etch Test: Seven spots, one to two centimeters in diameter, each consisting of the same developer were applied to a strip of unexposed positive printing plate at 30 second intervals. Thirty seconds after the last spot was applied (a total of 3.5 minutes), the strip was rinsed with water and dried with a paper towel.

Each spot was evaluated on a pass/fail scale. A pass meant that no damage to the photosensitive layer was noted. Failures varied from slight film blistering at the edge of the spot to complete removal of the photo sensitive layer.

An etch rating (ER) was assigned as the number of spots rated pass. Hence, a rating of 0 (ER=0) indicated film damage in less than thirty seconds, while a score of 7 (ER=7) indicated no damage after 3.5 minutes.

In the absence of an etch inhibiting additive, the ER rating was zero for an active developer, i.e., compositions able to remove the exposed film areas. Experience indicated that an ER rating of 2 or higher was needed for acceptable performance in a mechanical processor.

Developer compositions were tested as shown in Tables 1 and 2. The data demonstrate that certain additives inhibit image attack by the developer and some do not. The ER* indicates the highest Etch Rating observed for a formulation of the additive listed. The term EO indicates ethylene oxide and the term PO indicates propylene oxide.

Table 1 shows evaluated etch inhibitors which were found effective. Table 1 lists the additive evaluated, the ER* for that additive, and a chemical description of the etch inhibiting additive. Table 2 lists the additives which were found ineffective, i.e. ER*=0. In Table 2, the information listed is the same as that listed in Table 1.

TABLE 1

Etch Inhibitors Evaluated As Effective

| Additive | ER* | Chemical Description |
|---|---|---|
| Antarox ® BL-225 | 6 | Proprietary octyl/decyl alcohol + EO + PO |
| Antarox ® L-61 | 6 | EO/PO block copolymer |
| Barlox ® 12I | 5 | Amine oxide, probably branched $C_{12}$ |
| Brij ® 78 | 1 | Stearyl alcohol + 20 moles EO |
| Brij ® 700 | 4 | Stearyl alcohol + 100 moles EO |
| Carbowax ® PEG 3350 | 4 | Polyethylene glycol, 3350 mol wt |
| Carbowax ® PEG 8000 | 4 | Polyethylene glycol, 8000 mol wt |
| Igepal ® CO-520 | 1 | Nonylphenol + 5 moles EO |
| Igepal ® DM-710 | 2 | Dinonylphenol + 15 moles EO |
| Igepal ® RC-520 | 1 | Dodecylphenol + 6 moles EO |
| Mirataine ® ASC | 2 | Proprietary amphoteric |
| Plurafac ® A-39 | 5 | Alcohol ethoxylate |
| Pluronic ® 25R2 | 1 | EO/PO reverse block copolymer |

TABLE 1-continued

Etch Inhibitors Evaluated As Effective

| Additive | ER* | Chemical Description |
|---|---|---|
| Pluronic ® 31R1 | 5 | EO/PO reverse block copolymer |
| Pluronic ® F-68 | 5 | EO/PO block copolymer |
| Pluronic ® F-77 | 5 | EO/PO block copolymer |
| Pluronic ® F-108 | 4 | EO/PO block copolymer |
| Pluronic ® L-10 | 5 | EO/PO block copolymer |
| Pluronic ® L-31 | 6 | EO/PO block copolymer |
| Pluronic ® L-35 | 5 | EO/PO block copolymer |
| Pluronic ® L-43 | 7 | EO/PO block copolymer |
| Pluronic ® L-62 | 3 | EO/PO block copolymer |
| Pluronic ® L-101 | 5 | EO/PO block copolymer |
| Pluronic ® P-84 | 5 | EO/PO block copolymer |
| Rhodafac ® RA-600 & Antarox ® BL-225 | 6 | Phosphated alcohol ethoxylate & proprietary octyl/decyl alcohol + EO + PO |
| Rhodameen ® PN-430 | 1 | Tallowamine + 5 EO |
| Rhodasurf ® A-24 | 1 | Linear alcohol + 3 moles EO ($C_{12}$) |
| Rhodasurf ® DA-639 | 1 | Isodecyl alcohol + 6 moles EO |
| Rhodasurf ® LA-12 | 5 | Lauryl alcohol + 12 moles EO |
| Triton ® X-100 & Rhodacal ® BX-78 | 5 | Octylphenol + 10 moles EO and dibutylnaphthalene sulfonic acid, Na salt |

TABLE 2

Etch Inhibitors Evaluated As Ineffective

| Additive | ER* | Chemical Description |
|---|---|---|
| Bardac ® LF | 0 | Dioctyl dimethylammonium chloride |
| Carbowax ® PEG 200 | 0 | Polyethylene glycol, 200 mol wt |
| Carbowax ® PEG 400 | 0 | Polyethylene glycol, 400 mol wt |
| Hamposyl ® O | 0 | Oleoyl sarcosine |
| Rhodacal ® BX-78 | 0 | Dibutylnaphthalene sulfonic acid, Na salt |
| Rhodacal ® DS-4 | 0 | Dodecylbenzene sulfonic acid, sodium salt |
| Rhodameen ® VP-532SPB | 0 | Proprietary tallowamine ethoxylate |
| Silwet ® L-77 | 0 | Silicone glycol copolymer |
| Sucrose | 0 | Sugar |

EXAMPLE 2

A batch of Developer A was prepared by the following formulation

| | |
|---|---|
| STAR ® Sodium Silicate, 37% solids, PQ Corporation | 1431.0 g |
| Sodium Hydroxide Pellets | 423.0 |
| Dowfax ® 2A1, Dow Chemical Corp. | 19.5 |
| Antarox ® L-61, Rhone-Poulenc | 9.8 |
| Water | 17616.0 |
| TOTAL | 19499.3 |

This example demonstrates the use of a water insoluble etch inhibiting additive, Antarox® L-61, with a hydrotrope, Dowfax® 2A1. The compositions was prepared and tested. The batch gave satisfactory performance in a mechanical processor. Plates developed with this formulation gave satisfactory performance on a printing press.

EXAMPLE 3

A batch of Developer B was prepared as follows

| | |
|---|---|
| STAR ® sodium silicate solution | 7.40 pph |
| Sodium Hydroxide | 2.10 |
| Rhodasurf ® LA-12 | 0.05 |
| Water | 90.45 |

The composition was a satisfactory developer and gave an etch rating of 5 (ER=5) in the etch test. This example demonstrates the use of a water soluble etch inhibiting additive without the need for a hydrotrope.

EXAMPLE 4

A batch of Developer C was prepared as follows

| | |
|---|---|
| STAR ® sodium silicate solution | 7.30 pph |
| Sodium Hydroxide | 2.10 |
| Pluronic ® L-31 | 0.02 |
| Pluronic ® L-43 | 0.08 |
| Water | 90.52 |

The composition was a satisfactory developer and gave an etch rating of 7 (ER=7) in the etch test. This example demonstrates the use of mixed soluble and insoluble etch inhibiting additives without the need for a hydrotrope.

Table 3 shows etch rating data for several EO/PO block copolymers. The "First No." designates molecular weight of polypropylene glycol (PPG) and the "Last No." indicates the weight percent of the added ethylene oxide as designated in Nonionic Surfactants, Polyalkylene Oxide Block Copolymers, Chapter 10, p.310, by I. R. Schmolka, 1966. For example, 1, 0 (First No., Last No.) Indicates 100% PPG. The number shown in the table is the Etch Rating. ER=0 is poor and ER=7 is excellent. An X indicates that the product is commercially available, but was not tested. A blank cell indicates that the product is not commercially available. Table 3 demonstrates that the EO/PO block copolymer family of surfactants of the present invention contains an optimum composition for developer compositions.

TABLE 3

Pluronic® /Antarox® Etch Rating Summary

| First No. | 0 | 1 | 2 | 3 | 4 | 5 | 7 | 8 |
|---|---|---|---|---|---|---|---|---|
| 1 | 5 | | | | | | | |
| 3 | | 6 | | | | 5 | | X |
| 4 | | | | 7 | X | | | |
| 5 | | | | | | | | |
| 6 | | 6 | 3 | X | X | X | | 5 |
| 7 | | | X | | | X | 5 | |
| 8 | | X | | | 5 | X | X | X |
| 9 | | | X | | | | | X |
| 10 | | 5 | X | X | X | X | | 4 |
| 12 | | X | X | X | | X | | |

The data in Table 3 indicate that the L-43/L-31 composition is near the optimum (within the limis of experimental error) in this Antarox®/Pluronic® family. Antarox® and Pluronic® are different suppliers of brand names for EO/PO block co-polymer surfactants. Tests have at products, i.e. Antarox® L-61 is equivalent to Pluronic® L-61, perform similarly in this application.

EXAMPLE 5

The performance of three developers was compared on four typical plates in a Model PHW-32 mechanical processor manufactured by Agfa Division of Bayer Corporation. The results in Table 4, below.

In Table 4, an "Image" entry indicates the formation of a suitable image (both HL and SHDW 1 pixel Horizontal and Vertical line and 1–99% dots on an AGFA test strip) at 25"/min. "No image" indicates incomplete removal of exposed areas of the test pattern. "Image attack" indicates removal of unexposed areas of the test pattern. P-51 is a conventional positive plate, available from the AGFA division of Bayer Corporation, designed for exposure through a positive transparency with high actinic radiation. The Thermal Plate listed in Table 4 comprises an aluminum substrate having a surface coating comprising a cresol formaldehyde resin, a naphthoquinone diazide and carbon black. This plate is exposed by a high energy infrared laser imager, namely a Gerber Crescent 42/T laser imager rated at 200 Hz and 2540 dpi. N-81 and N-90 are negative working plates available from AGFA division, Bayer Corporation. N-81 is designed for projection speed imaging with visible light; N-90 is designed for exposure by a green (Argon or YAG) laser imager.

Developer D is a conventional developer containing sodium metasilicate and sodium hydroxide but without the etch inhibiting additives. The compositions of Developers A and B, described in the Examples 2 and 3, respectively, listed above, both contain etch inhibiting additives of the type claimed in the present invention.

The data demonstrate that a conventional developer like Developer D on a thermal plate gives insufficient development. When the temperature is raised, improved clean-out is observed, but it is accompanied by severe image attack. The result is insufficient operating latitude.

In Developers A and B, the alkalinity of the developer and/or the operating temperature could be increased giving a wider operating range of satisfactory development without image attack.

TABLE 4

The Effect of Developers on Various Printing Plates

| | P-51*** | | Thermal Plate | | N-81 | | N-90 | |
|---|---|---|---|---|---|---|---|---|
| | 85° F. | 95° F. | 85° F. | 95° F. | 85° F. | 95° F. | 85° F. | 95° F. |
| Developer D (Conventional) | Image | — | No Image | Image attack | — | — | — | — |
| Developer B* | — | — | Image | Image** | — | — | — | — |
| Developer A | Image | — | Image | Image | Image | — | Image | — |

*Tested at 32"/min.
**Tested at 90° F.

Developer compositions exemplified demonstrate that certain additives inhibit image attack by the developer and some do not. It is shown that the etch inhibiting additives of the present invention possess an optimum composition for developer compositions.

It should be understood that the foregoing summary, detailed description, and examples of the present invention are not intended to be limiting, but are only exemplary of the inventive features which are defined in the claims.

What is claimed is:

1. A developer composition for photosensitive elements which comprises:

a source of hydroxyl ions in an amount sufficient to produce a developer composition having a pH of from about 10 to about 14;

an etch inhibiting amount of an etch inhibiting additive of the formula:

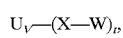

wherein,

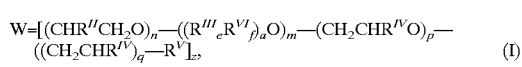                                                          (I)

$R^V$ is H, $PO_3H_2$, $SO_3Na$, $—CH_2CO_2H$, halogen, a linear or branched alkyl group, alkylaryl, arylalkyl, cycloalkyl, or alkylarylalkyl, $R^V$ having up to about 30 carbon atoms; $R^{II}$ and $R^{IV}$ are independently H, linear or branched alkyl group, alkylaryl, arylalkyl, cycloalkyl, or alkylarylalkyl, having up to about 30 carbon atoms; $R^{III}$ and $R^{VI}$ are independently methylene, alkyl methylene, dialkyl methylene, aryl methylene, cycloalkyl methylene, alkyl aryl methylene, or arylalkyl methylene, having up to about 30 carbon atoms; a=1 to about 30; e=0 to about 30, f=1 to about 30; z=1–3, m, n and p are zero or positive numbers up to about 150, provided that at least one of n, m and p is non-zero, and q is zero except q=1 when $R^V$ is a halogen;

and wherein, a) X is a halogen, v=0 and t=1; or, b) X is $R^I(CO)_dY$, wherein $R^I$ is H, $PO_3H_2$, $SO_3Na$, $-CH_2CO_2H$, a linear or branched alkyl group, alkylaryl, arylalkyl, cycloalkyl, or alkylarylalkyl, having up to about 30 carbon atoms, d=0 or 1, v=0, t=1, and Y=O, S, P or N; or, c) X is selected from the group consisting of O, N, S, P, esters, urethanes and amino resin linkages, U is a polymer chain backbone, and v=1, wherein the value of t is such that $(X-W)_t$ comprises greater than about 50 percent by weight of the total weight of the compound $U_v-(X-W)_t$;

wherein when the etch inhibiting additive is ethylene glycol homopolymer, it has a molecular weight of 3350 or above; and, sufficient water to produce a developer composition.

2. The composition of claim 1, wherein said developer composition further comprises a hydrotrope in an amount sufficient to form a uniformly dispersed developer composition.

3. The composition of claim 1, wherein X=$R^IY$; $R^I$=$R^V$=H, $R^{II}$=$R^{IV}$=H, $R^{III}$=$CH(CH_3)-$, $R^{VI}$=$CH_2$, a=1; Y=O, d=0, e=1, f=1, z=1, m is such that the molecular weight of the polypropylene glycol moiety is from about 500 to about 4000, q=0, and n and p are such that the weight of the ethylene oxide derived moiety is from about 10% to about 80% of the total weight of the etch inhibiting additive.

4. The composition of claim 1, wherein X=$R^IY$; $R^I$=$R^V$=H, $R^{II}$=$R^{IV}$=$CH_3-$, $R^{III}$=$CH_2$, $R^{VI}$=$CH_2$, a=1; Y=O, d=0, e=1, f=1, z=1, m is such that the molecular weight of the polyethylene glycol moiety is from about 1000 to about 3500, q=0, and n and p are such that the weight of the propylene oxide derived moiety is from about 10% to about 80% of the total weight of the etch inhibiting additive.

5. The composition of claim 1, wherein said pH is from about 12 to about 13.5.

6. The composition of claim 1, wherein said etch inhibiting additive is selected from the group consisting of an ethoxylate derivative having one or more terminal hydroxyls replaced with phosphate, sulfate, or ether carboxylate, an ethoxylate of a linear or branched primary alkyl amine, and an ethoxylate of linear or branched alkyl mercaptan.

7. The composition of claim 1, wherein said etch inhibiting additive has a hydrophilic/lipophilic balance greater than about 12.5.

8. The composition of claim 2, wherein said etch inhibiting additive has an hydrophilic/lipophilic balance greater than about 15.5 and the hydrotrope contains straight chain alkyl groups of greater than about 17 carbon atoms per chain.

9. The composition of claim 2, wherein when etch inhibiting additive is not an ethylene glycol homopolymer, it has a molecular weight greater than about 500 and the hydrotrope has about 6 carbon atoms or less.

10. The composition of claim 1, wherein said etch inhibiting additive comprises a polypropylene glycol moiety having a molecular weight of from about 1000 to about 3300, and from about 10% to about 80% ethylene oxide.

11. The composition of claim 10, wherein said etch inhibiting additive comprises a polypropylene glycol moiety having a molecular weight of from about 1000 to about 2000, and from about 10% to about 30% ethylene oxide.

12. The composition of claim 11, wherein said etch inhibiting additive comprises a polypropylene glycol moiety having a molecular weight of from about 1000 to about 1300, and from about 20% to about 30% ethylene oxide.

13. The composition of claim 1, wherein said etch inhibiting additive is present in an amount of from about 25 ppm to about 5% of the weight of the composition.

14. The composition of claim 1, wherein each of the component monomer units, $(CHR^{II}CH_2O)$, $(R^{III}_eR^{VI}_f)_aO)$, and $(CH_2CHR^{IV}O)$ may be present in the compound as block, gradient or randomly occurring copolymer units.

15. The composition of claim 1, wherein said composition further comprises a buffer in an amount sufficient to buffer said composition.

16. A method for forming an image comprising:

image-wise exposing a photosensitive element to actinic radiation, which photosensitive element comprises a substrate and a photosensitive composition on the substrate, which photosensitive composition comprises a photosensitizer and an alkali soluble binder; and then removing the non-image areas of the photosensitive composition by contacting the photosensitive composition with a developer comprising:

a source of hydroxyl ions in an amount sufficient to provide a developer composition to having a pH of from about 10 to about 14;

an etch inhibiting amount of an etch inhibiting additive of the formula:

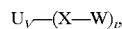

wherein,

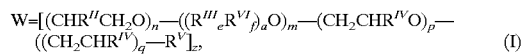
(I)

$R^V$ is H, $PO_3H_2$, $SO_3Na$, $-CH_2CO_2H$, halogen, a linear or branched alkyl group, alkylaryl, arylalkyl, cycloalkyl, or alkylarylalkyl, $R^V$ having up to about 30 carbon atomns; $R^{II}$ and $R^{IV}$ are independently H, linear or branched alkyl group, alkylaryl, arylalkyl, cycloalkyl, or alkylarylalkyl, having up to about 30 carbon atoms; $R^{III}$ and $R^{VI}$ are independently methylene, alkyl methylene, dialkyl methylene, aryl methylene, cycloalkyl methylene, alkyl aryl methylene, or arylalkyl methylene, having up to about 30 carbon atoms; a=1 to about 30; e=0 to about 30, f=1 to about 30; z=1–3; m, n and p are zero or positive numbers up to about 150, provided that at least one of n, m and p is non-zero, and q is zero except q=1 when $R^V$ is a halogen;

and wherein, a) X is a halogen, v=0 and t=1; or, b) X is $R^I(CO)_dY$, wherein $R^I$ is H, $PO_3H_2$, $SO_3Na$, $-CH_2CO_2H$, a linear or branched alkyl group, alkylaryl, arylalkyl, cycloalkyl, or alkylarylalkyl, having up to about 30 carbon atoms, d=0 or 1, v=0, t=1, and Y=O, S, P or N; or, c) X is selected from the group consisting of O, N, S, P, esters, urethanes and amino resin linkages, U is a polymer chain backbone, and v=1, wherein the value of t is such that $(X-W)_t$ comprises greater than about 50 percent by weight of the total weight of the compound $U_v-(X-W)_t$;

wherein when the etch inhibiting additive is ethylene glycol homopolymer, it has a molecular weigtht of 3350 or above; and, sufficient water to produce a developer composition.

17. The method of claim 16, wherein said developer composition further comprises a hydrotrope in an amount sufficient to form a uniformly dispersed developer composition.

18. The method of claim 16, comprising an etch inhibiting amount of an etch inhibiting additive wherein $X=R^I Y$; $R^I=R^V=H$, $R^{II}=R^{IV}=H$, $R^{III}=CH(CH_3)-$, $R^{VI}=CH_2$, $a=1$; $Y=O$, $d=0$, $e=1$, $f=1$, $z=1$, m is such that the molecular weight of the polypropylene glycol moiety is from about 500 to about 4000, $q=0$, and n and p are such that the weight of the ethylene oxide moiety is from about 10% to about 80% of the total weight of the etch inhibiting additive.

* * * * *